(12) United States Patent
Morita et al.

(10) Patent No.: US 6,706,645 B2
(45) Date of Patent: *Mar. 16, 2004

(54) METHOD OF MANUFACTURING A SEMICONDUCTOR DEVICE

(75) Inventors: Tomoyuki Morita, Tokyo (JP); Yusuke Harada, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/228,083

(22) Filed: Aug. 27, 2002

(65) Prior Publication Data

US 2002/0192951 A1 Dec. 19, 2002

Related U.S. Application Data

(62) Division of application No. 09/584,730, filed on Jun. 1, 2000, now Pat. No. 6,458,716.

(30) Foreign Application Priority Data

Jul. 30, 1999 (JP) .......................................... 11-216862
Jan. 20, 2000 (JP) ....................................... 2000-011730

(51) Int. Cl.$^7$ .................. H01L 21/469; H01L 21/4763; H01L 21/44
(52) U.S. Cl. ...................... 438/778; 438/637; 438/652; 438/642; 438/663; 438/685
(58) Field of Search ................................ 438/778, 637, 438/652, 642, 685, 656, 663

(56) References Cited

U.S. PATENT DOCUMENTS

| | | | |
|---|---|---|---|
| 5,705,442 A | | 1/1998 | Yen et al. |
| 5,801,098 A | * | 9/1998 | Fiordalice et al. .......... 438/653 |
| 6,136,690 A | | 10/2000 | Li |
| 6,458,716 B1 | * | 10/2002 | Morita et al. ............... 438/778 |

* cited by examiner

*Primary Examiner*—Matthew Smith
*Assistant Examiner*—Chuong A Luu
(74) *Attorney, Agent, or Firm*—Volentine Francos, PLLC

(57) ABSTRACT

A method of manufacturing a semiconductor device, according to the present invention comprises a step for forming an insulating film over a semiconductor wafer and thereafter subjecting the same to photolithography and etching to thereby define a contact hole, a step for forming an adhesive layer over the insulating film with the contact hole defined therein, a step for placing the interior of a processing chamber under an atmosphere uncontaining oxygen and subjecting the adhesive layer to heat treatment, a step for setting the temperature of the semiconductor wafer to less than or equal to a temperature equivalent to energy of such an extent as to cut the bonding between atoms which form the adhesive layer and thereafter taking the semiconductor wafer out of the processing chamber, and a step for forming an embedding film to be embedded in the contact hole.

19 Claims, 4 Drawing Sheets

METHOD OF MANUFACTURING A SEMICONDUCTOR DEVICE

CROSS REFERENCE TO RELATED APPLICATIONS

This is a divisional application of application Ser. No. 09/584,730, filed Jun. 1, 2000, now U.S. Pat. No. 6,458,716 which is hereby incorporated by reference in its entirety for all purposes.

BACKGROUND OF THE INVENTION

1. Field of the Invention

The present invention relates to a method of manufacturing a semiconductor device, and particularly to a technique for burying a contact hole or the like.

2. Description of the Related Art

According to a conventional technique for burying a contact hole or the like, an insulating film (such as an $SiO_2$ film, a BPSG film) is formed over an IC substrate. Thereafter, a contact hole is defined therein by photolithography and etching. Further, a contact or adhesive layer comprised of titanium (Ti) film, a titanium nitride (TiN) film or their layered film or the like is deposited over the insulating film. Afterwards, a tungsten film (CVD-W film) is deposited by a chemical vapor deposition method so as to be embedded in the contact hole. The process of growing or depositing the CVD-W film is roughly divided into two. A first step aims to form the nucleus of tungsten over the adhesive layer. The CVD-W film is deposited with tungsten hexafluoride ($WF_6$), monosilane ($SiH_4$) and hydrogen ($H_2$) principally as main materials.

The sequence of the first step is as follows. A semiconductor wafer is placed in a pressure-reduced chamber and the temperature in the chamber is increased to a deposition temperature. Next, $WF_6$ and $SiH_4$ used as material or raw gases are introduced therein to form a thin film of tungsten, which is called "nucleus formation". In a second step, $SiH_4$ is cut off and a CVD-W film good in step coverage is deposited with $WF_6$ and $H_2$ principally as main materials. After the CVD-W film has been embedded in the contact hole, the CVD-W film is left only within the contact hole by full-face etchback.

With a reduction in temperature for the manufacture of an LSI and an improvement in step coverage, there has recently been an increasing demand for the deposition of the CVD-W film under a low-temperature condition.

However, the deposition of the CVD-W film under the conventional low-temperature condition might develop abnormal growth of a protrusion or the like considered to be composed principally of tungsten at a stage corresponding to the first step, for performing the formation of the nucleus of tungsten over the adhesive layer. The magnitude of the abnormal growth of the protrusion or the like is a size close to the diameter of the contact hole and it is grown from above the adhesive layer. Therefore, when the abnormal growth is developed on the contact hole in the first step, a W film is actually deposited in the next step. However, the abnormal growth blocks the contact hole so that the deposition gases do not enter into the contact hole, thus causing an embedment failure in contact hole. The presence or absence of the occurrence of the abnormal growth in the first step differs according to the type of adhesive layer. Namely, it greatly depends on the state of the surface of the adhesive layer. Particularly when the surface of the adhesive layer is oxidized upon the subsequent heat treatment, $WF_6$ and $SiH_4$ used the deposition gases are not absorbed into the surface of the adhesive layer in the first step at the deposition of the CVD-W film. Therefore, an Incubation Time becomes long and the abnormal growth occur.

Incidentally, the Incubation Time indicates a deposition delay time during which while a material gas flows into a chamber in the first step, a CVD-W film is not deposited over a wafer till a given time that elapsed since it has flowed therein. A problem arises in that when the Incubation Time becomes long, abnormal growth occurs during the Incubation Time and blocks a hole, so that an embedment failure in hole occurs.

SUMMARY OF THE INVENTION

An object of the present invention is to provide a method of manufacturing a semiconductor device, which is capable of inhibiting abnormal growth at the deposition of a CVD-W film and reducing an embedment failure in contact hole due to the abnormal growth.

According to one aspect of the invention, for achieving the above object, there is provided a method of manufacturing a semiconductor device, comprising a step for forming an insulating film over a semiconductor wafer and thereafter subjecting the same to photolithography and etching to thereby define a contact hole, a step for forming an adhesive layer over the insulating film with the contact hole defined therein, a step for placing the interior of a processing chamber under an atmosphere that does not contain oxygen and subjecting the adhesive layer to heat treatment, a step for setting the temperature of the semiconductor wafer to less than or equal to a temperature equivalent to energy of such an extent as to cut the bonding between atoms which form the adhesive layer and thereafter taking the semiconductor wafer out of the processing chamber, and a step for forming an embedding film to be embedded in the contact hole.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects, features of the invention and further objects, features and advantages thereof will be better understood from the following description taken in connection with the accompanying drawings in which:

DESCRIPTION OF THE PREFERRED EMBODIMENTS

Preferred embodiments of the present invention will hereinafter be described in detail with reference to the accompanying drawings.

First Embodiment

Figure 1:
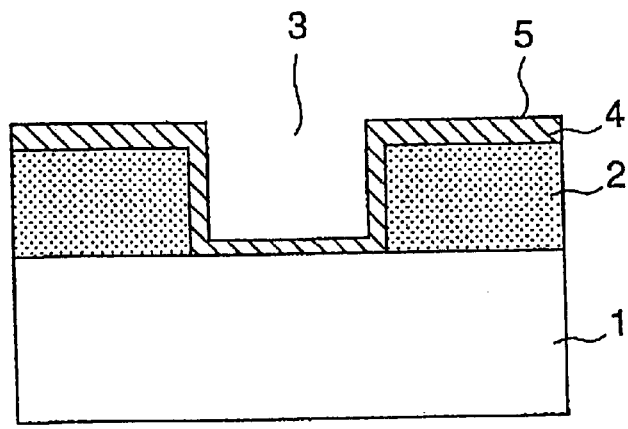
FIG. 1 is a process view showing first through sixth embodiments of the present invention.
Figure 2:
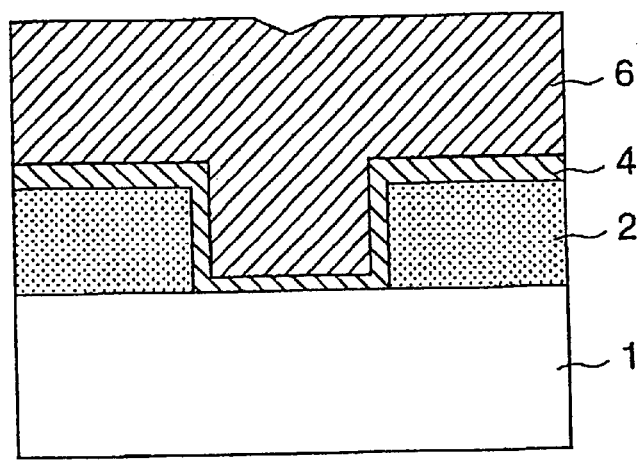
FIG. 2 is a process view illustrating the first through sixth embodiments of the present invention.
Figure 3:
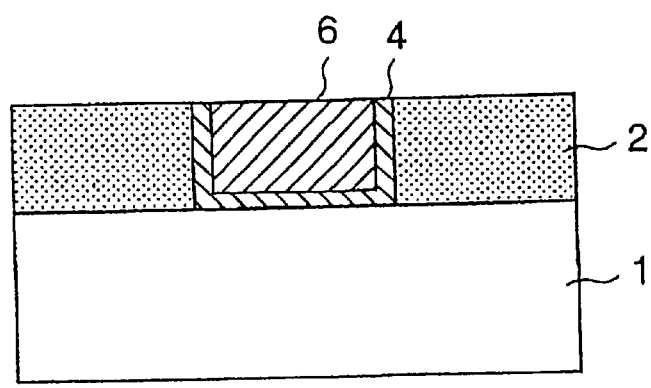
FIG. 3 is a process view depicting the first through sixth embodiments of the present invention.
Figure 4:
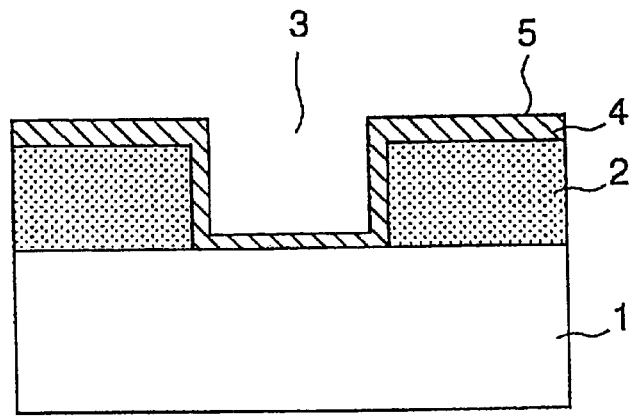
FIG. 4 is an explanatory view showing a seventh embodiment of the present invention.
Figure 5:
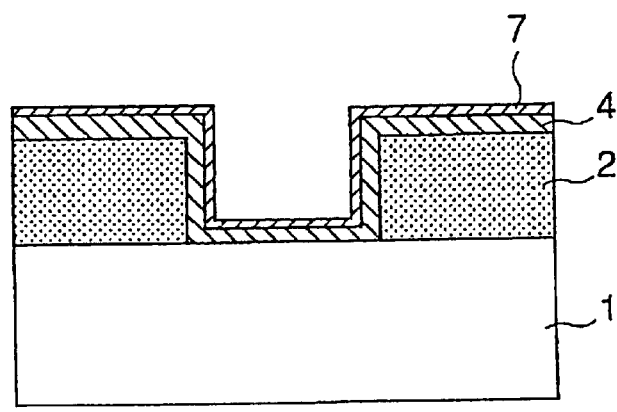
FIG. 5 is an explanatory view illustrating the seventh embodiment of the present invention.
Figure 6:
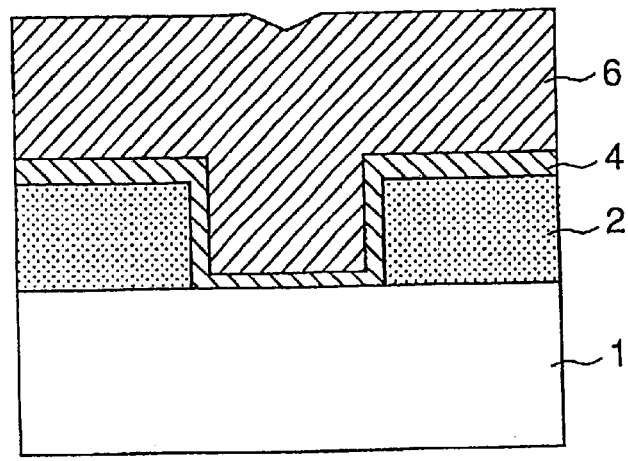
FIG. 6 is an explanatory view depicting the seventh embodiment of the present invention.
Figure 7:
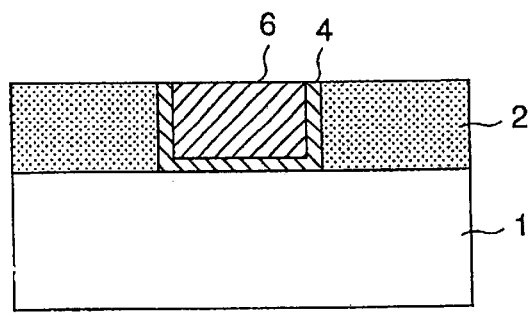
FIG. 7 is an explanatory view showing the seventh embodiment of the present invention.

FIGS. 1 through 3 are process views showing first through sixth embodiments of the present invention respectively. An insulating film 2 such as an $SiO_2$ film, a boro-phospho silicate glass film (BPSG film) is formed over an IC substrate 1. Thereafter, a contact hole 3 is defined in the insulating film 2 by photolithography and etching. Next, a contact or adhesive layer 4 comprised of Ti, TiN or their layered film is deposited or grown on the entire surface of the insulating film 2. The occurrence of abnormal growth greatly depends on a bed, i.e., the surface 5 of the adhesive layer 4. Particularly when the adhesive layer 4 is bonded to oxygen due to heat treatment of the adhesive layer 4, abnormal growth will occur upon deposition of a CVD-W film, which corresponds to the next process step.

Figure 10:
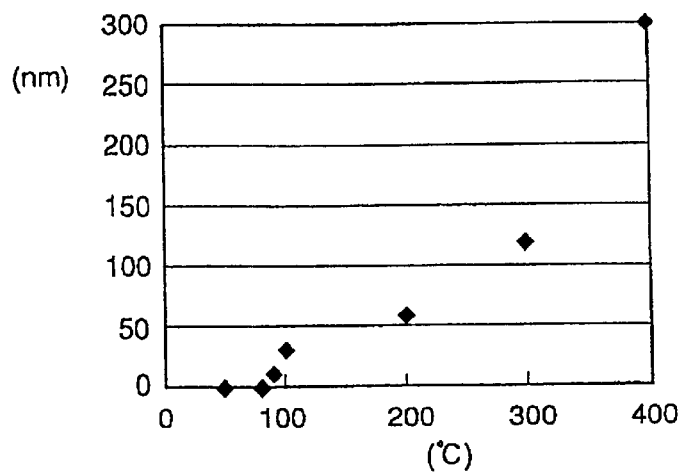
FIG. 10 is an explanatory view showing the relationship between abnormal growth and temperature.

The present inventors of the invention of the present application found that the adhesive layer 4 comprised of Ti, TiN or their stacked film was easily bonded to oxygen when heat higher than about 80° C. was added thereto in an atmosphere containing oxygen. This result is shown in FIG. 10. FIG. 10 is an explanatory view showing the relationship between abnormal growth and the temperature of a semiconductor wafer. The vertical axis indicates an abnormal growth size (nm) and the horizontal axis indicates temperature (° C.). As is apparent from FIG. 10, the occurrence of the abnormal growth does not appear if the temperature of the semiconductor wafer is less than or equal to 80° C. Reversely, the more the temperature of the semiconductor wafer becomes higher than or equal to 80° C., the more the abnormal growth prominently occurs. Namely, it can be understood that a temperature equivalent to energy of such an extent as to cut the bonding between atoms which form the adhesive layer 4, is about 80° C.

Thus, in the present embodiment, the temperature of the semiconductor wafer is set so as not to be higher than or equal to 80° C. in the atmosphere containing oxygen when the adhesive layer 4 is subjected to heat treatment and the semiconductor wafer is taken out of a heat treat furnace or a chamber. The heat treatment is normally carried out so that oxygen is not mixed in upon annealing (for example, RTA or the like in a nitrogen atmosphere). At this time, the extraction of the semiconductor wafer in an atmosphere containing oxygen after the heat treatment in a state in which the temperature of the semiconductor wafer is higher than 80° C., will be avoided.

Afterwards, a CVD-W film 6 is deposited or grown to bury the contact hole. A growth sequence for the CVD-W film 6 is similar to the prior art. After the contact hole 3 has been buried by the CVD-W film 6, the CVD-W film 6 is left only within the contact hole 3 by full-face etchback.

According to the first embodiment as described above, since the temperature of the semiconductor wafer is set to less than or equal to 80° C. within the atmosphere containing oxygen when the adhesive layer is subjected to heat treatment, the surface of the adhesive layer can be prevented from entering into combination with oxygen. Thus, the surface of the adhesive layer can be maintained in a metallic state. Accordingly, the oxidation of the adhesive layer, which is responsible for the abnormal growth, does not occur. It is thus possible to inhibit the abnormal growth at the deposition of the CVD-W film and reduce an embedment failure in contact hole due to the abnormal growth.

Second Embodiment

In the present embodiment, in a first step for the deposition or growth of a CVD-W film 6, a semiconductor wafer is placed within a pressure-reduced chamber and the temperature therein is increased by an inert gas. Thereafter, $WF_6$ is sprayed on the surface of the semiconductor wafer. A spraying time must be made longer than a deposition delay time (Incubation Time). Described specifically, 5 seconds or longer are needed as the spraying time when the growth or deposition temperature is 460° C. Alternatively, a time interval longer than 5 seconds is required if the deposition temperature becomes low. Afterwards, $H_2$, $SiH_4$ and $WF_6$ used as raw gases are caused to flow. A deposition sequence in a second step is similar to the prior art. After the CVD-W film 6 is embedded into its corresponding contact hole 3, the CVD-W film 6 is left only within the contact hole 3 by full-face etchback.

According to the second embodiment as described above, when the CVD-W film is deposited, the semiconductor wafer is put into the pressure-reduced chamber and the temperature therein is increased to the growth temperature. Thereafter, only the $WF_6$ is sprayed over the surface of the semiconductor wafer. Thus, oxides (e.g., TiON, TiOX, etc.) such as TiN, Ti, etc. each corresponding to the top surface of an adhesive layer are removed by etching through the use of $WF_6$ ($WF_6$+(TiON, TiOX)→W+$TiOF_2$+$WOF_4$).

As a result, the oxides of TiN and Ti are removed and thereby the surface of the adhesive layer results in a metal, thus making it possible to inhibit abnormal growth at the deposition of the CVD-W film and reduce an embedment failure in contact hole due to its abnormal growth.

Third Embodiment

In the present embodiment, in a first step for the deposition or growth of a CVD-W film 6, a semiconductor wafer is inserted into a pressure-reduced chamber and the temperature therein is increased by an inert gas. Thereafter, $H_2$ or $SiH_4$ used as a raw gas, or a gas mixed with it is sprayed over the surface of the semiconductor wafer. The above processing has been executed on the order of a pressure (a few hpa) in the first step in the prior art, whereas in the present embodiment, $H_2$, $SiH_4$ and a mixed gas thereof are sprayed on the surface of the semiconductor wafer at a pressure (e.g., about 60 hpa through 400 hpa) under which the oxidation of the surface of the semiconductor wafer is sufficiently reduced. Afterwards, $H_2$, $SiH_4$ and $WF_6$ used as raw gases are caused to flow. A growth sequence in a second step is similar to the prior art. After the CVD-W film 6 has been embedded into its corresponding contact hole 3, the CVD-W film 6 is left only within the contact hole 3 by full-face etchback.

According to the third embodiment as described above, when the CVD-W film is deposited, the semiconductor wafer is placed within the pressure-reduced chamber and $H_2$ or $SiH_4$ or their mixed gas is sprayed over the surface of the semiconductor wafer at the pressure (e.g., about 60 hpa through 400 hpa) under which the oxidation of the surface of the semiconductor wafer is sufficiently reduced, whereby an oxide of TiN or Ti (such as TiON, TiOX or the like) formed over the surface of an adhesive layer is reduced. Thus, the surface of the adhesive layer results in a TiN or Ti metal.

In the present embodiment as well, the reducing process of the surface of the adhesive layer and the growth of the CVD-W film are continuously carried out within the same chamber. Described in detail, external oxygen is cut off and the above reduction and growth are continuously processed within the same vacuumized chamber. As a result, the surface of the adhesive layer can be prevented from re-oxidation. It is thus possible to inhibit abnormal growth at the deposition of the CVD-W film and reduce an embedment failure in contact hole due to the abnormal growth.

Fourth Embodiment

Abnormal growth occurs in a first step for depositing a CVD-W film 6. This is considered to disappear by increasing its deposition temperature. The deposition temperature in this case depends on the flow rate of $WF_6$, which flows during the first step. Deposition temperatures in first and second steps were conventionally constant upon deposition of the CVD-W film 6. In the present embodiment, the CVD-W film 6 is grown at the deposition temperature in the first step, which is higher than that in the second step. Other deposition sequences are similar to the prior art.

Described specifically, a semiconductor wafer is placed within a pressure-reduced chamber, and the temperature therein is increased to a temperature higher than the deposition temperature in the second step. Next, $H_2$, $SiH_4$ and $WF_6$ used as raw gases are caused to flow. In the second step, the deposition temperature is lowered to the conventional deposition temperature to cut off $SiH_4$. Thereafter, a CVD-W film 6 good in step coverage is grown with $WF_6$ and $H_2$ as main materials principally. Then the CVD-W film 6 is embedded in a contact hole 3 and thereafter left only within the contact hole 3 by full-face etchback.

According to the fourth embodiment as described above, the CVD-W film is deposited at the deposition temperature in the first step, which is higher than that in the second step, whereby the etching removal of a TiN or Ti oxide (such as TiON, TiOX or the like) on the surface of an adhesive layer by $WF_6$ can be activated in the first step. Owing to the activation of etching by $WF_6$, the oxide film of TiN or Ti is removed from the surface of the adhesive layer. It is thus possible to inhibit abnormal growth at the deposition of the CVD-W film and reduce an embedment failure in contact hole due to the abnormal growth.

Fifth Embodiment

In the present embodiment, heat treatment subsequent to the growth of an adhesive layer 4 and the deposition of a CVD-W film 6, which corresponds to the next process step, are carried out in the form of continuous processing so as to cut off external oxygen and through a vacuumized state or a state purged by an inert gas. Described specifically, a semiconductor wafer is taken out under such an environment that external oxygen is cut off (within a load lock chamber, for example) after the heat treatment. Alternatively, the semiconductor wafer is taken out under an environment placed in a state purged by the inert gas from vacuum. Thereafter, the CVD-W film 6 is grown while the external oxygen is being held in the cut-off state. Further, the CVD-W film 6 deposited according to the deposition sequence similar to the prior art is embedded in a contact hole 3. Thereafter, the CVD-W film 6 is left only within the contact hole 3 by full-face etchback.

According to the fifth embodiment as described above, the heat treatment of an adhesive layer and the deposition of the CVD-W film are carried out so as to cut off the external oxygen and in a vacuum state or an inert gas-based purged state. Thus, the oxidation (e.g., the formation of TiON, TiOX or the like) of the surface of the adhesive layer, which leads to abnormal growth developed upon the deposition of the CVD-W film, can be inhibited.

It is thus possible to prevent the oxidation of the surface of the adhesive layer, inhibit the abnormal growth at the deposition of the CVD-W film, and reduce an embedment failure in contact hole due to the abnormal growth.

Further, since the semiconductor wafer was taken out of the chamber after the reduction of the temperature of the semiconductor wafer to a low temperature in order to prevent the surface of the adhesive layer from being oxidized after the heat treatment, much processing time was conventionally needed. Since the transfer of the semiconductor wafer is carried out in a vacuum in the present embodiment, the semiconductor wafer can be placed within the chamber for the deposition of the CVD-W film without a reduction in the temperature of the semiconductor wafer subsequent to the heat treatment, so that throughput can be greatly improved.

Sixth Embodiment

In the present embodiment, a plasma-based reducing process is effected on the surface 5 of an adhesive layer before the deposition of a CVD-W film 6. Described specifically, a plasma process is executed by using ammonia ($NH_3$), hydrogen ($H_2$), phosphine ($PH_3$), monosilane ($SiH_4$), disilane ($Si_2H_6$), diborane pentafluoride ($B_2HF_5$) or the like. The subsequent deposition of CVD-W film 6 and embedding thereof in a contact hole 3 are similar to other embodiments.

According to the sixth embodiment as described above, an oxide (such as TiON, TiOX) on the surface of the adhesive layer (comprised of e.g., Ti, TiN or their layered film), which leads to the abnormal growth developed upon the deposition of the CVD-W film, is reduced by the plasma process (e.g., the plasma process using $NH_3$, $H_2$, $PH_3$, $SiH_4$, $Si_2H_6$ and $B_2HF_5$) (the surface of the adhesive layer results in the metal Ti or TiN in this case). It is thus possible to inhibit the abnormal growth caused by the oxidation of the surface of the adhesive layer at the deposition of the CVD-W film and reduce an embedment failure in contact hole.

Seventh Embodiment

FIGS. 4 through 7 are respectively process views showing a seventh embodiment of the present invention. In the present embodiment, a metal thin film (such as Si) 7 is grown over an adhesive layer 4 by sputter evaporation or plasma CVD after the deposition of the adhesive layer 4 or the heat treatment thereof. While a CVD-W film 6 is deposited over the metal thin film 7 after the deposition of the metal thin film 7, the deposition sequence of the CVD-W film 6 is similar to the prior art. The deposition of the metal thin film 7 and the deposition of the CVD-W film 6 may be continuously processed within the same chamber which has cut off external oxygen and has been vacuumized. Further, a thickness equivalent to such an extent that it is possible to absorb a deposition gas, will be enough for the thickness of the metal thin film 7. The subsequent embedding of the CVD-W film in a contact hole 3 is similar to other embodiments.

According to the seventh embodiment as described above, since the metal thin film is grown over the adhesive layer, $WF_6$ used as the deposition gas is capable of easily forming the nucleus of tungsten in a first step for the deposition of the CVD-W film by using the metal thin film deposited over the surface of the adhesive layer and $SiH_4$ caused to flow within the chamber in the first step. Thus, a deposition delay time (Incubation Time) developed due to the non-absorption of the deposition gas into a semiconductor wafer due to an oxide (such as TiON, TiOX) formed over the surface of the adhesive layer is shortened, so that the growth of the nucleus of tungsten is carried out efficiently. It is thus possible to inhibit abnormal growth at the deposition of the CVD-W film and reduce an embedment failure in contact hole due to the abnormal growth.

Eighth Embodiment

Figure 8:
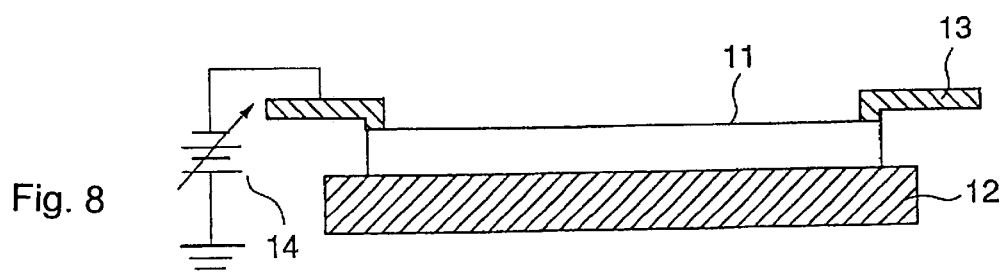
FIG. 8 is an explanatory view illustrating an eighth embodiment of the present invention.

FIG. 8 is an explanatory view showing an eighth embodiment of the present invention. The deposition of a CVD-W film is normally carried out as follows: A semiconductor wafer 11 is placed over a susceptor 12 lying within a chamber, and a process for depositing the CVD-W film is executed while the semiconductor wafer 11 is being held by an electrically-insulated clamp ring 13. In a first step for depositing the CVD-W film, the semiconductor wafer 11 is inserted into a pressure-reduced chamber and the temperature therein is increased to a deposition temperature. Next, $WF_6$ and $SiH_4$ used as material or raw gases are introduced into the chamber to form a CVD-W thin film, which is called "formation of nucleus of tungsten". At this time, the nucleus of tungsten is formed by the exchange of free electrons between $WF_6$ and $SiH_4$ used as the raw gases.

Namely, Si is absorbed into the surface of an adhesive layer from $SiH_4$ and the free electrons are supplied to F of $WF_6$, whereby $WF_6$ results in $WF_5$ and Si is terminated at F. Further, the free electrons are supplied even to $WF_5$ from Si so that $WF_5$ becomes $WF_4$. Only the nucleus of tungsten is finally obtained by repeating it. In other words, the formation of the nucleus of tungsten is done by a chemical reaction of $2WF_6+SiH_4 \rightarrow 2W+3SiF_4+6H_2$. However, there may be cases in which the supply of the free electrons from Si absorbed into the surface of the adhesive layer is not sufficiently done depending on the state of the surface of the adhesive layer. When, for example, the surface of the adhesive layer is being oxidized, no Si is absorbed into the surface. As a result, a deposition delay time (Incubation Time) becomes long.

In the present embodiment, a negative bias is applied to the semiconductor wafer from a negative bias source 14 through the clamp ring 13 to start the deposition of the CVD-W film in the first step for depositing the CVD-W film. Another deposition sequence is similar to the prior art. It is further needless to say that the application of a negative bias to the semiconductor wafer 11 through the clamp ring 13 even in a second step in addition to the application of the negative bias to the semiconductor wafer 11 through the clamp ring 13 in the first step alone is effective.

According to the eighth embodiment as described above, since the negative bias is applied to the semiconductor wafer through the clamp ring upon deposition of the CVD-W film, the surface of the semiconductor wafer can sufficiently be replenished with the electrons. As a result, $WF_6$ can sufficiently accept the electrons from the surface of the semiconductor wafer regardless of the state of the surface of the adhesive layer, thus making it possible to efficiently become the nucleus of tungsten through WFx (where x=1 to 5). Accordingly, the deposition delay time (Incubation Time) can be shortened.

Further, WFx (where x=1 to 5) capable of being created by accepting the electrons from the surface of the semiconductor wafer has the effect of removing an oxide over the surface of the adhesive layer by etching, which is significant as compared with the effect of $WF_6$. Namely, since the oxide formed over the surface of the adhesive layer can be removed with efficiency, the deposition delay time (Incubation Time) can be shortened.

It is thus possible to shorten the deposition delay time (Incubation Time) which contributes to the occurrence of abnormal growth and reduce an embedment failure in contact hole due to the abnormal growth.

Ninth Embodiment

Figure 9:
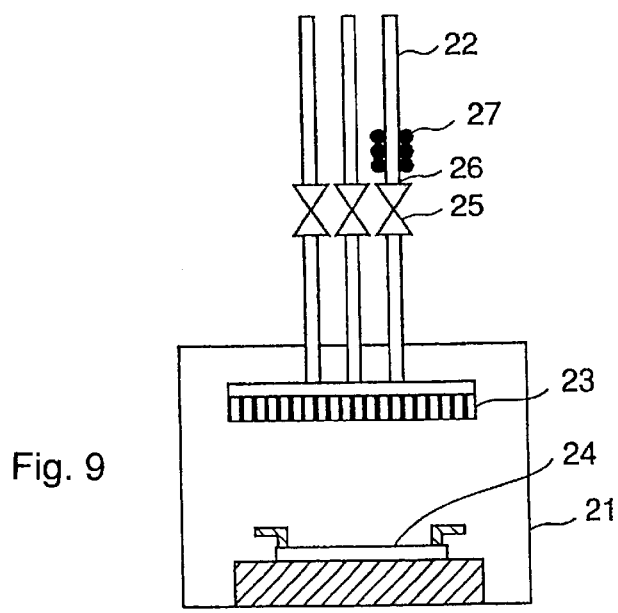
FIG. 9 is an explanatory view depicting a ninth embodiment of the present invention.

FIG. 9 is an explanatory view showing a ninth embodiment of the present invention. A deposition gas normally flows through piping or pipes 22 such as SUS, etc. and is supplied into a chamber 21 through a shower head 23. In a first step for depositing a CVD-W film, $H_2$, $SiH_4$ and $WF_6$ used as deposition gases to be supplied are respectively supplied to the surface of a semiconductor wafer 24 through the independent pipes 22. In the surface of the semiconductor wafer 24, $WF_6$ used as the deposition gas results in $WF_{6-X}$ (where X=1 to 5) owing to the swapping of free electrons with $SiH_4$ and finally leads to tungsten, whereby the generation of nucleus thereof is done.

In the present embodiment, $WF_6$ is supplied through a portion 26 of the pipe 22 whose inner wall is coated with tungsten by a few centimeters (about 5 cm) as viewed from a stop valve 25. Further, $WF_6$ is supplied into the chamber 21 through the shower head 23. As a preferred example, the above portion 26 is heated by a heater 27 or the like. As an alternative method, an unillustrated filter (e.g., a tungsten cork, a net composed of tungsten, a tungsten heater may be provided) composed of tungsten may be provided immediately before the stop valve 25 lying within each pipe 22. When the filter made of tungsten is provided within the pipe 22, the heating of its place is also effective.

Other deposition gases $H_2$ and $SiH_4$ are supplied into the chamber 21 by a method similar to the prior art. It is needless to say that the supply of $WF_6$ through the portion 26 or the supply of $WF_6$ through the pipe provided with the above-described filter made of tungsten is also effective even in the subsequent second step.

According to the ninth embodiment as described above, $WF_6$ is supplied to the surface of the semiconductor wafer through the pipe whose inner wall is coated with tungsten. Thus, $WF_6$ results in $WF_{6-X}$ (where X=1 to 5) at the portion coated with tungsten and is thereafter supplied into the chamber. As a result, since the swapping of free electrons with the surface of the semiconductor wafer is done with efficiency as compared with $WF_6$, the growth of the nucleus of tungsten can be carried out in a short time. Accordingly, a deposition delay time (Incubation Time) can be shortened and an embedment failure in contact hole due to abnormal growth can be reduced.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a semiconductor device, comprising:

forming an insulating film on a semiconductor wafer;

forming a contact hole in the insulating film;

forming a first metal film including titanium on the insulating film and in the contact hole;

annealing the first metal film in an atmosphere of an inert gas;

exposing the annealed first metal film to an atmosphere containing oxygen, after the wafer has cooled down approximately equal to or less than 80° C.; and forming a second metal film on the annealed first metal film after said exposing, wherein the second metal film is embedded in the contact hole.

2. The method according to claim 1, wherein the second metal film is tungsten film.

3. The method according to claim 2, wherein said forming a second metal film comprises:

increasing a temperature of a processing chamber that holds the semiconductor wafer by an inert gas; and spraying a tungsten hexaflouride gas into the processing chamber for a time longer than a deposition delay time of the second metal film.

4. The method according to claim 2, wherein said forming a second metal film comprises:

increasing a temperature of a processing chamber that holds the semiconductor wafer by an inert gas;

spraying a mixed gas of $H_2$ or $SiH_4$ into the processing chamber at a pressure of about 60 hpa to 400 hpa; and spraying a mixed gas including tungsten hexaflouride gas into the processing chamber.

5. The method according to claim 2, wherein said forming a second metal film comprises:

supplying tungsten hexaflouride into a processing chamber that holds the semiconductor wafer from a pipe having an inner wall coated with tungsten, the pipe having the inner wall coated with tungsten being heated.

6. The method according to claim 1, wherein the first metal film is a titanium nitride film.

7. The method according to claim 1, wherein the first metal film comprises stacked films of titanium and titanium nitride.

8. The method according to claim 1, wherein a negative bias is applied to the semiconductor wafer during said forming a second metal film.

9. The method according to claim 1, wherein said annealing comprises a rapid thermal annealing in a nitrogen atmosphere.

10. A method of manufacturing a semiconductor device, comprising:

forming an insulating film on a semiconductor wafer;

forming a contact hole in the insulating film;

forming a first metal film on the insulating film and in the contact hole;

annealing the first metal film;

exposing the annealed first metal film to an atmosphere containing oxygen, after the wafer becomes approximately equal to or less than 80° C.; and forming a second metal film on the annealed first metal film, wherein the second metal film is embedded in the contact hole.

11. The method according to claim 10, wherein the second metal film is tungsten film.

12. The method according to claim 11, wherein said forming a second metal film comprises:

increasing a temperature of a processing chamber that holds the semiconductor wafer by an inert gas; and spraying a tungsten hexaflouride gas into the processing chamber for a time longer than a deposition delay time of the second metal film.

13. The method according to claim 11, wherein said forming a second metal film comprises:

increasing a temperature of a processing chamber that holds the semiconductor wafer by an inert gas;

spraying a mixed gas of $H_2$ or $SiH_4$ into the processing chamber at a pressure of about 60 hpa to 400 hpa; and spraying a mixed gas including tungsten hexaflouride gas into the processing chamber.

14. The method according to claim 11, wherein said forming a second metal film comprises:

supplying tungsten hexaflouride into a processing chamber that holds the semiconductor wafer from a pipe having an inner wall coated with tungsten, the pipe having the inner wall coated with tungsten being heated.

15. The method according to claim 10, wherein the first metal film is a titanium film.

16. The method according to claim 10, wherein the first metal film is a titanium nitride film.

17. The method according to claim 10, wherein the first metal film comprises stacked films of titanium and titanium nitride.

18. The method according to claim 10, wherein a negative bias is applied to the semiconductor wafer during said forming a second metal film.

19. The method according to claim 10, wherein said annealing comprises a rapid thermal annealing in a nitrogen atmosphere.

* * * * *